United States Patent
Lin et al.

(10) Patent No.: US 10,545,379 B2
(45) Date of Patent: Jan. 28, 2020

(54) DISPLAY DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li (TW)

( * ) Notice: Subject to any disclaimer, the term of this patent is extended or adjusted under 35 U.S.C. 154(b) by 177 days.

(21) Appl. No.: 15/886,793

(22) Filed: Feb. 1, 2018

(65) Prior Publication Data

US 2019/0235320 A1     Aug. 1, 2019

(51) Int. Cl.
    *G02F 1/1335*     (2006.01)

(52) U.S. Cl.
    CPC .. *G02F 1/133617* (2013.01); *G02F 1/133504* (2013.01); *G02F 1/133514* (2013.01); *G02F 1/133553* (2013.01); *G02F 1/133602* (2013.01)

(58) Field of Classification Search
None
See application file for complete search history.

(56) References Cited

U.S. PATENT DOCUMENTS

| | | | | |
|---|---|---|---|---|
| 10,193,042 B1* | 1/2019 | Tsai | ........................ | H01L 33/62 |
| 2014/0009723 A1 | 1/2014 | Cho | | |
| 2014/0160408 A1* | 6/2014 | Cho | .................. | G02F 1/133617 |
| | | | | 349/110 |
| 2015/0285969 A1* | 10/2015 | Kim | ....................... | G02B 5/201 |
| | | | | 359/891 |
| 2015/0362648 A1* | 12/2015 | Park | .................. | G02F 1/133528 |
| | | | | 349/96 |
| 2016/0062178 A1* | 3/2016 | Kim | ...................... | G02B 1/005 |
| | | | | 349/106 |
| 2016/0195773 A1* | 7/2016 | Lee | ................... | G02F 1/133617 |
| | | | | 349/71 |
| 2016/0195774 A1* | 7/2016 | Lee | ................... | G02F 1/133617 |
| | | | | 349/43 |
| 2016/0306226 A1 | 10/2016 | Yoon | | |
| 2016/0377263 A1 | 12/2016 | Lee | | |
| 2017/0003438 A1 | 1/2017 | Im | | |
| 2017/0183565 A1 | 6/2017 | Jun | | |
| 2017/0278911 A1* | 9/2017 | Toyoda | ............... | H01L 51/5271 |
| 2017/0343859 A1* | 11/2017 | Chen | ...................... | G02B 5/201 |
| 2018/0102449 A1* | 4/2018 | Pschenitzka | ...... | G02F 1/133617 |
| 2018/0156951 A1* | 6/2018 | Baek | ................. | G02F 1/133617 |
| 2018/0202616 A1* | 7/2018 | Yoon | ......................... | F21V 9/40 |
| 2018/0210280 A1* | 7/2018 | Chen | ................... | H01L 51/0097 |
| 2019/0064600 A1* | 2/2019 | Jang | .................. | G02F 1/133617 |
| 2019/0067533 A1* | 2/2019 | Chen | ..................... | H01L 33/504 |
| 2019/0250462 A1* | 8/2019 | Lin | .................... | G02F 1/133528 |

* cited by examiner

*Primary Examiner* — Ryan Crockett
(74) *Attorney, Agent, or Firm* — Winston Hsu

(57) ABSTRACT

A display device is provided and includes a substrate and a light converting film disposed on the substrate, the light converting film has a first surface and a second surface opposite to the first surface, the light converting film has a thickness H. The light converting film has at least one first element including Ti, Zr, Al, In, Zn, Sn, Sb, Si, Au, Ag, Cu, Pt, Fe, Co, Ni, or Mn. At least one first element conforms to the following condition: a content of the first element in a region between the first surface and 0.1H of the light converting film is defined as a first content. A content of the first element in a region between 0.1H of the light converting film and the second surface is defined as a second content, and a ratio of the second content to the first content is ranged from 0.1 to 0.9.

20 Claims, 5 Drawing Sheets

DISPLAY DEVICE

BACKGROUND OF THE DISCLOSURE

1. Field of the Disclosure

The present disclosure relates to a display device, and more particularly, to a display device having a light converting film with different contents of a first element in different regions thereof.

2. Description of the Prior Art

To raise the color saturation of a display device for better image quality, an approach which applies light converting materials (e.g., quantum dot materials) to different sub-pixels is proposed. Although the light converting materials are capable of converting the color of backlight into required colors, a part of the backlight may still penetrate through a light converting film with the light converting material as a part of an output light, thereby limiting purity of the color of the output light. To purify the color of the output light to raise the range of the color gamut is always indeed.

SUMMARY OF THE DISCLOSURE

According to an embodiment, a display device is provided by the present disclosure. The display device includes a substrate and a light converting film disposed on the substrate. The light converting film has a first surface and a second surface opposite to the first surface, and the light converting film has a thickness H in a normal direction. The light converting film has at least one first element selected from the group consisting of Ti, Zr, Al, In, Zn, Sn, Sb, Si, Au, Ag, Cu, Pt, Fe, Co, Ni, and Mn, and the at least one first element conforms to a following condition: a content of the first element in a first region between the first surface of the light converting film and 0.1H of the light converting film is defined as a first content, a content of the first element in a second region between 0.1H of the light converting film and the second surface of the light converting film is defined as a second content, and a ratio of the second content to the first content is ranged from 0.1 to 0.9.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
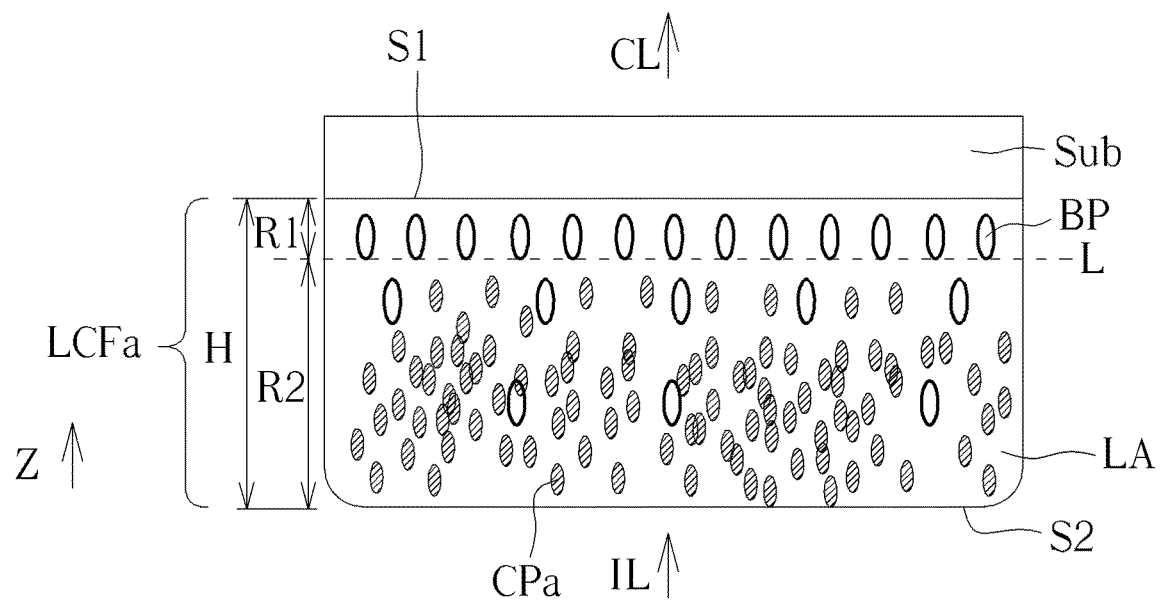
FIG. 1 is a schematic diagram illustrating a light converting film on a substrate according to an embodiment of the present disclosure.

Refer to FIG. 1, which is a schematic diagram illustrating a light converting film on a substrate according to an embodiment of the present disclosure. The substrate Sub is used for carrying the light converting film LCFa, but not limited thereto. The substrate Sub may be a transparent substrate, but not limited thereto. The light converting film LCFa disposed on the substrate Sub is used to convert an input light IL into a required converted light CL, and the light converting film LCFa has a first surface S1 and a second surface S2 opposite to the first surface S1. The second surface S2 is faced to the backlight module (or light source) of the display device. The second surface S2 is defined as a surface adjacent to the backlight module (or light source) of the display device, and the first surface S1 is defined as a surface away from the backlight module (or light source) of the display device. In this embodiment, the first surface S1 is close to or in contact with the substrate Sub. In this embodiment, the light converting film LCFa has a thickness H, the thickness H of the light converting film LCFa in a top view direction Z can be measured from a center region of the first surface S1 to a center region of the second surface S2, but not limited. The thickness H of the light converting film LCFa can be the spacing between the first surface S1 and the second surface S2. The input light IL enters the light converting film LCFa from the second surface S2, and the converted light CL generated from the light converting film LCFa is emitted out from the first surface S1.

The light converting film LCFa has at least one first element selected from the group consisting of Ti, Zr, Al, In, Zn, Sn, Sb, Si, Au, Ag, Cu, Pt, Fe, Co, Ni, and Mn. Also, a level L in the light converting film LCFa is defined to be spaced apart from the first surface S1 by 0.1 times the thickness H (H/10). A region between the first surface S1 and the level L is defined as a first region R1, and a region between the level L and the second surface S2 of the light converting film LCFa is defined as a second region R2. In other words, the level L is defined as a boundary between the first region R1 and the second region R2, a thickness of the first region is 0.1 times the thickness H (H/10), and a thickness of the second region is 0.9 times the thickness H (9H/10). The first element conforms to a following condition: a content of the first element in the first region R1 is defined as a first content, a content of the first element in the second region R2 is defined as a second content, and a ratio of the second content to the first content (second content/first content) is ranged from 0.1 to 0.9. That is to say, the content of the first element in the first region R1 can be greater than the content of the first element in the second region R2.

In this embodiment, the light converting film LCFa may have a plurality of light blocking particles BP to reduce the input light IL from penetrating through the light converting film LCFa, and the light blocking particles BP have at least one first element so as to absorb, reflect or scatter the input light IL. Specifically, the light blocking particles BP include at least one of metal oxide (including metalloid oxide) and metal, but not limited. The metal oxide has at least one first element selected from the group consisting of Ti, Zr, Al, In, Zn, Sn, Sb, and Si, for example the metal oxide include $TiO_2$, $ZrO_2$, $Al_2O_3$, $In_2O_3$, ZnO, $SnO_2$, $Sb_2O_3$, $SiO_2$, combinations thereof or other suitable material, but not limited. The metal has at least one first element selected from the group consisting of Au, Ag, Cu, Pt, Fe, Co, Ni, and Mn, for example the metal includes Au, Ag, Cu, Pt, Fe, Co, Ni, Mn, combinations thereof or other suitable material, but not limited thereto.

In this embodiment, the light blocking particles BP may include a plurality of first light blocking particles including the metal oxide (including metalloid oxide) and a plurality of second light blocking particles including the metal. Since the first light blocking particles formed of the metal oxide may be used to absorb the input light IL, and the first light blocking particles may not be used to absorb the input light IL in the second region R2, the ratio of the second content to the first content of the first element of the metal oxide is ranged from 0.1 to 0.5, but not limited, which means most of the first light blocking particles of the metal oxide are disposed in the first region R1. Furthermore, since the second light blocking particles formed of the metal may be used to reflect or scatter the input light IL so as to extend the moving path of the input light IL in the light converting film LCFa. The ratio of the second content to the first content of the first element of the metal is ranged from 0.5 to 0.9, but not limited, which means the ratio of the metal can be greater than the ratio of the metal oxide. Because the input light IL enters the light converting film LCFa from the second surface S2, the input light IL would meet the metal more than the metal oxide, and the moving path of the input light IL can be enhanced. Thus, the input light IL can get more possibility to convert into the converted light CL in the second region R2. Furthermore, a part in the second region R2 of the light converting film LCFa closer to the first surface S1 is defined as a first part, a part in the second region R2 of the light converting film LCFa closer to the second surface S2 is defined as a second part, and a content of the first element in the first part is greater than a content of the first element in the second part, i.e. when the part of the light converting film LCFa is closer to the first surface S1, the content of the first element is greater, so that the input light IL can be converted as much as possible into the converted light CL (or get less possibility to penetrate through the light converting film LCFa). In another embodiment, the first light blocking particles having the metal oxide (or other suitable material) may be disposed in the first region R1, and the second light blocking particles having the metal (or other suitable material) are dispersed in (or throughout) the light converting film LCFa. In another embodiment, the light converting film LCFa may mostly have the metal oxide, and the ratio of the second content to the first content is ranged from 0.1 to 0.5, but not limited. In another embodiment, the light converting film LCFa may mostly have the metal, and the ratio of the second content to the first content is ranged from 0.5 to 0.9, but not limited.

More specifically, since the light blocking particles BP with different sizes may have different blocking effects for the lights with different wavelengths, and the light blocking particles BP with different materials may also have different blocking effects, the size of the light blocking particles BP may be determined according to the design requirement. For example, the size of at least one of the first light blocking particles BP may be ranged from 50 nm to 600 nm, and the particle size of each of the second light blocking particles BP is ranged from 50 nm to 600 nm, but not limited, so that the first light blocking particles BP and the second light blocking particles BP can provide better blocking effect for the input light IL or less loss of the input light IL. Also, the size of the first light blocking particle BP may be same as or different from the size of the second light blocking particle BP. The ratio of the number of the first light blocking particles BP to the number of second light blocking particles BP may be adjusted based on the design requirement.

The light converting film LCFa further has at least one second element selected from the group consisting of Cd, Te, Pb, Cs, Rb, Mg, Se, and Ga, and the at least one second element conforms to another following condition: a content of the second element in the first region R1 of the light converting film LCFa is defined as a third content, a content of the second element in the second region R2 of the light converting film LCFa is defined as a fourth content, and a ratio of the third content to the fourth content (third content/fourth content) is ranged from 0.1 to 0.9, but not limited. In this embodiment, the light converting film LCFa has a plurality of light converting particles CPa, and the light converting particles CPa have the at least one second element and are used to convert the input light IL into the converted light CL. For example, at least one of the light converting particle CPa may include quantum dot (or quantum rods) material, phosphor material or color filter material. When the light converting particles CPa include a plurality of quantum dots (or quantum rods), quantum dot may be composed of a shell and a core disposed therein, the material of the core may include CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, or ZnO, and the material of the shell may include ZnS, CdS, ZnSe, CdSe, ZnTe, CdTe, PbS, TiO, SrSe, CdO, ZnO, InP, InS, GaP, GaN, GaO, InZnP, InGaP, InGaN, InZnSCdSe, or HgSe, but not limited thereto. A core size (e.g., a diameter or maximum width of a core) of the quantum dot is greater than or equal to 2 nanometers (nm) and less than or equal to 10 nanometers (nm), wherein the color of the converted light CL converted by quantum dot varies as the core size of the quantum dot material varies. For example, the core size of quantum dot may be ranged from 4 nm to 6 nm when the color of the converted light is red; the core size of the quantum dot may be 2.5 nm to 4.0 nm when the color of the converted light is green; and the core size of quantum dot may be ranged from 2 nm to 3 nm when the color of the converted light is blue, but not limited thereto. Additionally, the core size may be measured by a transmission electron microscope (TEM) for example. Furthermore, the wavelength of the input light IL may be less than the wavelength of the converted light CL, but not limited thereto. For example, in this embodiment, the input light IL may be blue light, and the converted light CL may be red light or green light. In some embodiment, the input light IL may be UV light, and the converted light CL may be red light, green light, and blue light. In some embodiment, the input light IL may be UV light or blue light, and the converted light CL may be one of red light, green light, blue light, and other color of light.

A method for measuring the content of the first element, the content of the second element or the content of other element in the light converting film LCFa is described herein in detail. The content may be for example obtained from a transmission electron microscopy (TEM) equipped with energy-dispersive X-ray spectrometer (EDX), secondary-ion mass spectrometer (SIMS), X-ray photoelectron spectrometer (XPS) or other suitable equipment. The TEM equipped with EDX is taken as an example in the following description. For the TEM-EDX analysis, electron beams are irradiated to a measure point (small spot of region) in a cross-section or a side surface (such as first surface S1 or second surface S2, but not limited) of the light converting film, and then different characteristic X-rays representing different elements are emitted and detected. Through measuring the number of the emitted characteristic X-rays, the number of the corresponding elements (some specific elements in measurement setting) in the measure point can be obtained, a percentage of the elements (such as the first element or the second element) in the measure point can be calculated, and a weight percentage of the elements in the measure point can be calculated through multiply the number of the elements by its atomic weight. In this embodiment, a plurality of measure points in the first region R1 may be chosen and measured to obtain the corresponding weight percentage of the first element, for example three measure points (or suitable number of measure points) can be chosen, and the first content of the first element in the first region R1 are obtained by averaging the weight percentages of the first element in the measure points. The second content of the first element, the third content of the second element, the fourth content of the second element, and the content of other element in a specific region can be obtained by the same or similar method as the first content.

In this embodiment, the light converting film LCFa may further have a layer LA, and the light converting particles CPa (or/and the light blocking particles BP) may be disposed in the layer LA. In some embodiments, the layer LA may include light converting material, such as phosphor material, color filter material or other suitable material, but not limited herein. The formation method of the light converting film LCFa is further described herein. For example, the light blocking particles BP and the light converting particles CPa may be added in (or mixed in) the liquid solution, and the liquid solution is disposed on the substrate Sub so as to form the light converting film LCFa. The liquid solution may include dispersant, polymer, monomer, photo-initiator, solvent and additive or other suitable material, but not limited thereto. Since the size of light blocking particle BP is greater than the size of light converting particle, most of the light blocking particles BP may be adjacent to the substrate Sub, or most of the light converting particles may be disposed in (or dispersed in) the light converting film LCFa and may be expelled into the second region R2. Thus, the concentration of the light blocking particles BP in the first region R1 can be greater than that in the second region R2, and the concentration of the light converting particles CPa in the second region R2 can be greater than that in the first region R1. The formation method of the light converting film LCFa in the present disclosure is not limited herein. In another embodiment, the light blocking particles BP and the light converting particles CPa may be added in (or mixed in) different liquid solutions, and the liquid solution with the light blocking particles BP and the liquid solution with the light converting particles CPa are sequentially disposed on the substrate Sub when the liquid solution with the light blocking particles BP first disposed on the substrate Sub is not dried, so that a part of the light blocking particles BP may be diffused into the liquid solution with the light converting particles CPa and a part of the light converting particles CPa may be diffused into the liquid solution with the light blocking particles BP, but not limited.

As mentioned above, through the ratio of the second content to the first content of the light converting film LCFa being designed to be ranged from 0.1 to 0.9, the light blocking particles BP of the light converting film LCFa can provide better scattering for the input light IL in the light converting film LCFa or provide absorption of the input light IL, to reduce the input light IL from penetrating through the light converting film LCFa. Accordingly, the color of the output light emitted from the first surface S1 may be close to or the same as the color of the converted light CL, thereby increasing the purity of the color of the output light.

Figure 2:
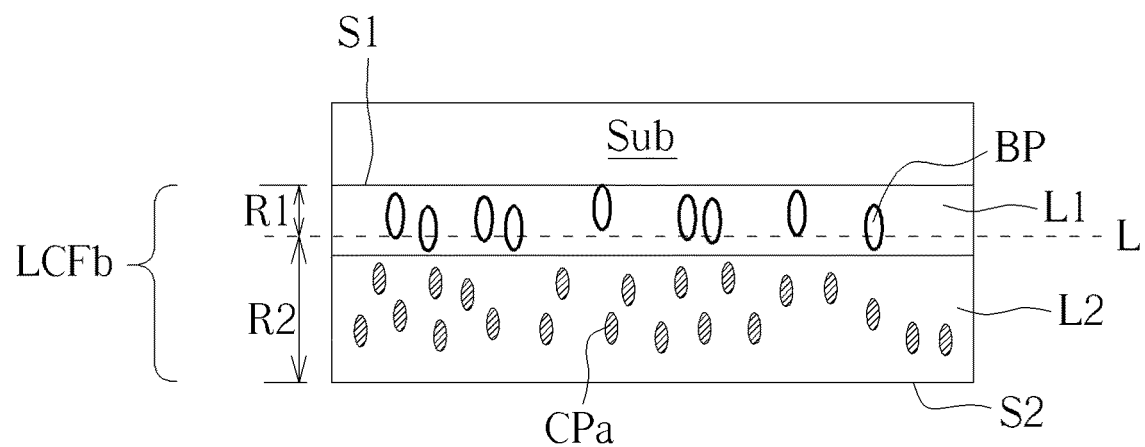
FIG. 2 is a schematic diagram illustrating a light converting film according to a variant embodiment of the embodiment of the present disclosure.

The light converting film LCFa of the present disclosure is not limited to the above mentioned embodiment. Refer to FIG. 2, which is a schematic diagram illustrating a light converting film according to a variant embodiment of the embodiment of the present disclosure. Compared with FIG. 1 of the above embodiment, the light converting film LCFb has a first layer L1 and a second layer L2, the first layer L1 is disposed between the second layer L2 and the substrate Sub, the first element is disposed in the first layer L1, and the second element is disposed in the second layer L2. Specifically, the light blocking particles BP and the light converting particles CPa may be added in (or mixed in) different liquid solutions, and the liquid solution with the light blocking particles BP and the liquid solution with the light converting particles CPa are sequentially disposed on the substrate Sub, so as to form the first layer L1 having the light blocking particles BP, and the second layer L2 having the light converting particles CPa. The first layer L1 and the second layer L2 is sequentially stacked on the substrate Sub. The liquid solutions may be the same as the liquid solution of the first embodiment, but not limited thereto. A thickness of the first layer L1 may be greater than the thickness of the first region R1, but not limited thereto.

The light converting particles CPa of the above embodiment may be replaced by a plurality of quantum rods (Q-rod). The quantum rod may have light converting function or light modulating function, the modulating function due to its rod-like (short bar-like or football-like) shape or birefringence property that cause polarization or phase retardation. The quantum rod may play as an optical modulating element similar to the function of linear polarizer, quarter wave plate ($\lambda/4$ phase retarder), or half wave plate ($\lambda/2$ phase retarder). Since the quantum rods have a characteristic of converting linearly polarized light into circularly polarized light, the light converting film can also serve as a quarter wave plate. In another variant embodiment, the light converting film may also have the first layer L1 for disposing the light blocking particles BP and the second layer L2 for disposing the light converting particles CPa of the above variant embodiment.

Figure 3:
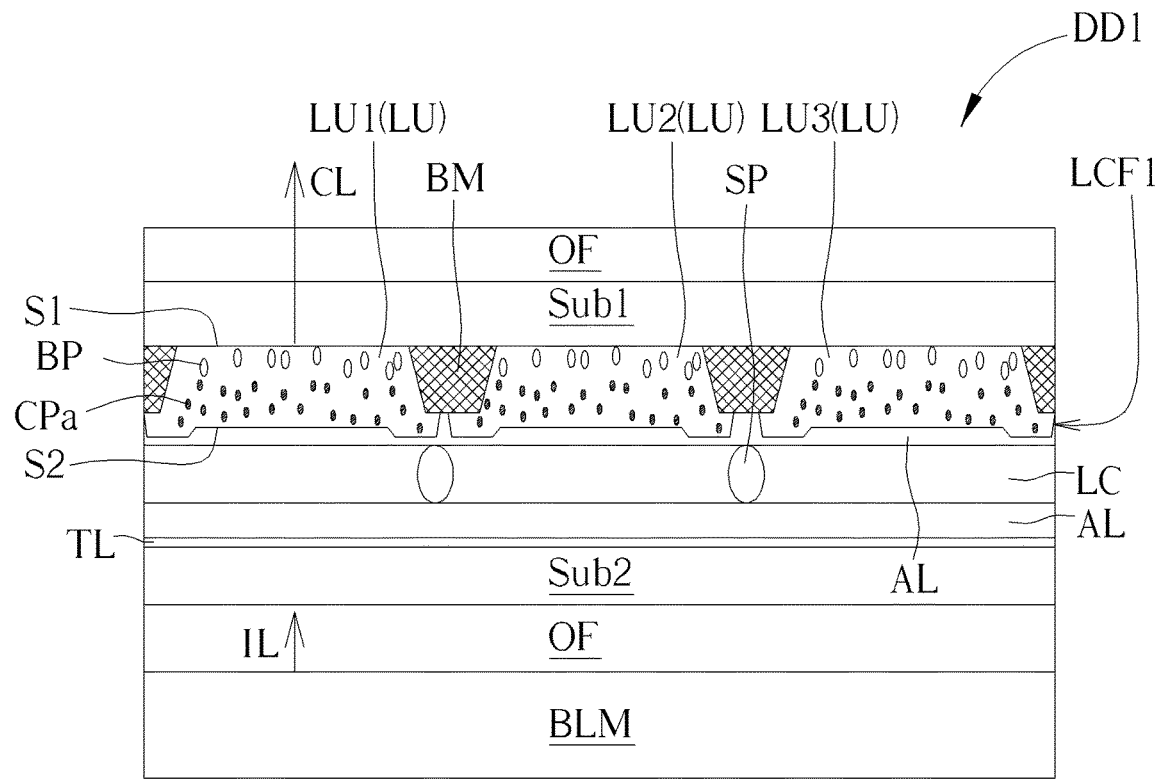
FIG. 3 is a schematic diagram illustrating a display device according to a first embodiment of the present disclosure.

The light converting film of the embodiment or any one of the variant embodiments may be applied to a display device. Refer to FIG. 3, which is a schematic diagram illustrating a display device according to a first embodiment of the present disclosure. The display device DD1 of this embodiment includes a first substrate Sub1, a second substrate Sub2, and a light converting film LCF1. The first substrate Sub1 and the second substrate Sub2 are disposed opposite to each other, and the light converting film LCF1 is disposed between the first substrate Sub1 and the second substrate Sub2. In some embodiments, the light converting film LCF1 is disposed on an inner surface of the first substrate Sub1, and the second surface S2 of the light converting film LCF1 faces the second substrate Sub2.

The light converting film LCF1 has a plurality of light converting units LU arranged on (formed on) the first substrate Sub1. At least one of the light converting units LU of this embodiment may be the same as or similar to the light converting film LCFa (or the light converting film LCFb) of the above embodiment, and will not be detailed herein. One light converting unit LU may correspond to a sub-pixel or a pixel. Since the light converting units LU can increase the purity of the color of the output lights, the range of the color gamut of the display device DD1 can be enhanced.

In this embodiment, the light converting units LU may include a plurality of first light converting units LU1, a plurality of second light converting units LU2 and a plurality of third light converting units LU3, but not limited. The first light converting unit LU1, the second light converting unit LU2, the third light converting unit LU3 may convert the input light IL into the converted lights with different colors. For example, the quantum dots in first light converting unit LU1, the quantum dots in second light converting unit LU2, and the quantum dots in third light converting unit LU3 may have different core sizes so as to generate different color lights, but not limited herein. Furthermore, according to the scattering ability or absorbing ability of the light blocking particles BP to different color lights or the design requirement, at least two of the number of the light blocking particles BP in the first light converting unit LU1, the number of the light blocking particles BP in the second light converting unit LU2, and the number of the light blocking particles BP in the third light converting units LU3 may be identical or non-identical. In this embodiment, one first light converting unit LU1, one second light converting unit LU2 and one third light converting unit LU3 may be disposed in three sub-pixels constituting one pixel respectively, for example in a red sub-pixel, a green sub-pixel and a blue sub-pixel, but not limited thereto. Based on different pixel arrangement, the numbers of the sub-pixels for generating different colors of the present disclosure may be identical or non-identical.

In addition, the display device DD1 of some embodiments may be a non-self-luminous display device. For example, the display device DD1 may be a liquid crystal display device, but not limited thereto. Specifically, the display device DD1 may further have a backlight module BLM, a second substrate Sub2, a liquid crystal layer LC, a black matrix BM, and a thin film transistor (TFT) layer TL. The backlight module BLM is used as a light source for providing the input light IL, and the backlight module BLM is disposed under the second surfaces S2 of the light converting film LCF1. In some embodiments, the second substrate Sub2 is disposed between the backlight module BLM and the first substrate Sub1, and the liquid crystal layer LC is disposed between the first substrate Sub1 and the second substrate Sub2. In some embodiment, the light converting film LCF1 is disposed between the first substrate Sub1 and the liquid crystal layer LC. The black matrix BM has a plurality of openings to define one sub-pixel or one pixel, and one light converting unit may be disposed in (or adjacent to) one opening, but not limited. The black matrix BM is disposed for separating the light converting units LU, or reducing the converted lights CL generated from the adjacent light converting units LU interfering with each other, so the black matrix BM is disposed between the adjacent light converting units LU. The TFT layer TL is disposed between the liquid crystal layer LC and the second substrate Sub2. The TFT layer TL may include, but not limited to, transistors, gate lines, data lines, common lines, electrodes, capacitors, wirings or other driving elements and parts for instance. In this embodiment, the display device DD1 may further have two alignment layers AL, and at least one optical film OF. One of the alignment layers AL is disposed between the second substrate Sub2 and the liquid crystal layer LC, and another of the alignment layers AL is disposed between the liquid crystal layer LC and the light converting films LCF1. The optical films OF may be polarizer or retarder (linear polarizer, half wave plate or quarter wave plate) disposed on an outer side of the first substrate Sub1, or between the backlight module BLM and the second substrate Sub2. The location or number of the above components (such as optical films OF, the alignment layers AL) are only examples, and can be adjusted or changed according to requirements. Also, the display device DD1 may further have spacers SP disposed adjacent to the liquid crystal layer LC, and the spacers SP disposed between the first substrate Sub1 and the second substrate Sub2. In some embodiments, the optical film OF between the backlight module BLM and the second substrate Sub2 may further have other optical film OF (such as brightness enhancement films, but not limited thereto).

The display device of the present disclosure is not limited by the aforementioned embodiment, and may have other different embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 4:
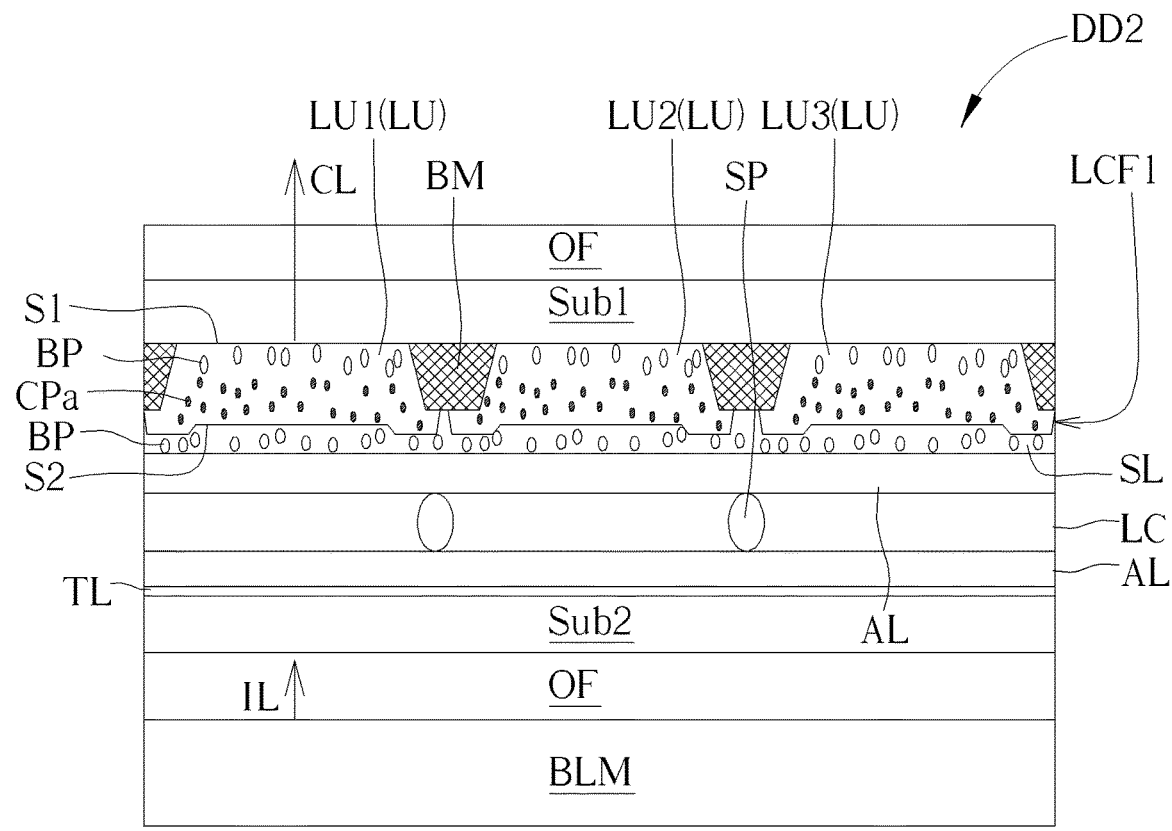
FIG. 4 is a schematic diagram illustrating a display device according to a second embodiment of the present disclosure.

Refer to FIG. 4, which is a schematic diagram illustrating a display device according to a second embodiment of the present disclosure. Compared with FIG. 3 of the first embodiment, the display device DD2 further includes a light scattering layer SL disposed between the second surfaces S2 of the light converting film LCF1 and the second substrate Sub2, and the light scattering layer SL having at least one third element selected from the group consisting of Au, Ag, Cu, Pt, Fe, Co, Ni, and Mn, but not limited. Specifically, the light scattering layer SL may include light blocking particles BP having the third element. In another embodiment, at least one of the light converting units LU may be the same as or similar to the light converting film LCFb (or the light converting film LCFa) of the above variant embodiments.

Figure 5:
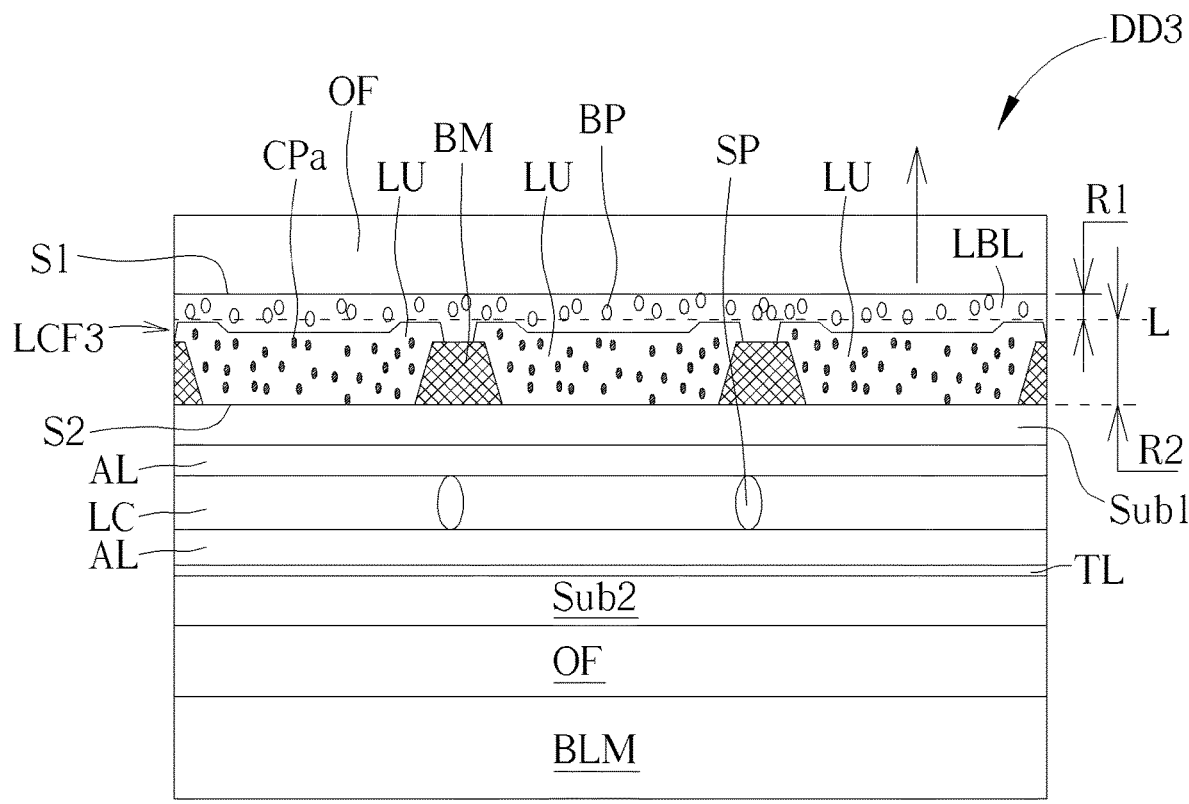
FIG. 5 is a schematic diagram illustrating a display device according to a third embodiment of the present disclosure.

Refer to FIG. 5, which is a schematic diagram illustrating a display device according to a third embodiment of the present disclosure. Compared with FIG. 3 of the first embodiment, the light converting film LCF3 is disposed on an outer surface of the first substrate Sub1 in the display device DD3. Specifically, the second surface S2 of the light converting film LCF3 is adjacent to the first substrate Sub1, and the first surface S1 of the light converting film LCF3 is away from the first substrate Sub1. In some embodiments, the light converting film LCF3 is disposed on the first substrate Sub1, so the input light IL enters the light converting film LCF3 from the second surface S2 and the converted light CL can emit out from the first surface S1. In some embodiments, the light converting film LCF3 has a plurality of light converting units LU, and a light blocking layer LBL disposed on the light converting units. The light converting units LU has the light converting particles CPa that have at least one second element selected from the group consisting of Cd, Te, Pb, Cs, Rb, Mg, Se, and Ga and doesn't have the first element, but not limited thereto. The light blocking layer LBL has the light blocking particles BP that have at least one first element selected from the group consisting of Ti, Zr, Al, In, Zn, Sn, Sb, Si, Au, Ag, Cu, Pt, Fe, Co, Ni, and Mn. The metal oxide has at least one first element selected from the group consisting of Ti, Zr, Al, In, Zn, Sn, Sb, and Si, for example the metal oxide include $TiO_2$, $ZrO_2$, $Al_2O_3$, $In_2O_3$, $ZnO$, $SnO_2$, $Sb_2O_3$, $SiO_2$, or combinations thereof, but not limited. The metal has at least one first element selected from the group consisting of Au, Ag, Cu, Pt, Fe, Co, Ni, and Mn, for example the metal includes Au, Ag, Cu, Pt, Fe, Co, Ni, Mn, or combinations thereof, but not limited thereto. In this embodiment, the first region R1 may be defined in the light blocking layer LBL, and the second region R2 may extend from the light blocking layer LBL to the light converting unit LU, so a ratio of the second content to the first content in this embodiment can be still ranged from 0.1 to 0.9. In another embodiment, at least one light converting unit LU may have the light blocking particles BP, and the light blocking particles have at least one first element selected from the group consisting of Ti, Zr, Al, In, Zn, Sn, Sb, Si, Au, Ag, Cu, Pt, Fe, Co, Ni, and Mn. In another embodiment, at least one of the light converting units LU may apply two layers of the light converting film LCFb of the above variant embodiment or the quantum rods of the light converting film LCFc of the above variant embodiment.

Figure 6:
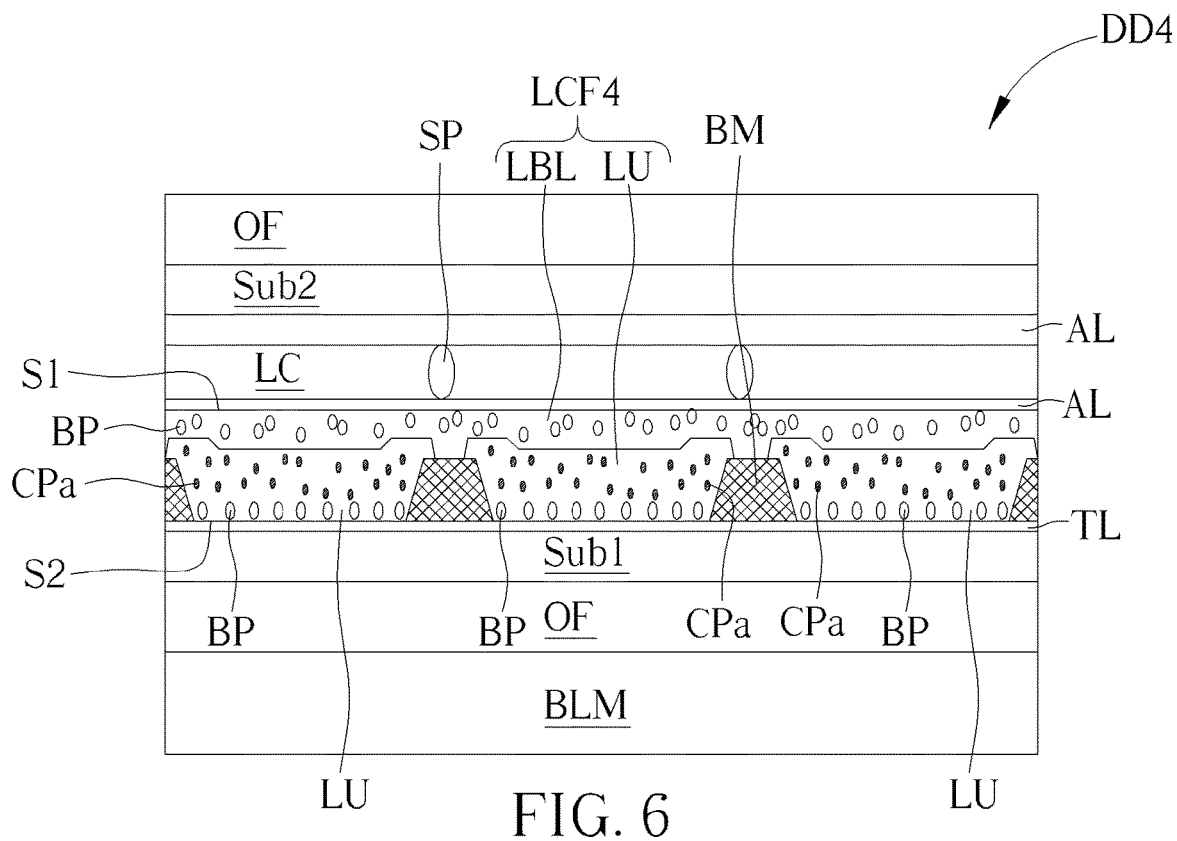
FIG. 6 is a schematic diagram illustrating a display device according to a fourth embodiment of the present disclosure.

Refer to FIG. 6, which is a schematic diagram illustrating a display device according to a fourth embodiment of the present disclosure. Compared with FIG. 5 of the third embodiment, the light converting film LCF4 of the display device DD4 provided in this embodiment is disposed between the liquid crystal layer LC and the backlight module BLM. In some embodiments, the first substrate Sub1 is disposed between the second substrate Sub2 and the backlight module BLM, the light converting film LCF4 is disposed on (or formed on) the first substrate Sub1, and the light converting film LCF4 has the first surface S1 opposite to the second surface S2, so the input light IL enters the light converting film LCF4 from the second surface S2 and the converted light CL can emit out from the first surface S1. In some embodiments, the light converting unit LU may have the light converting particles CPa and the light blocking particles BP, and the light converting unit LU has at least one first element selected from the group consisting of Ti, Zr, Al, In, Zn, Sn, Sb, Si, Au, Ag, Cu, Pt, Fe, Co, Ni, and Mn, as compared with FIG. 5 of the third embodiment, but not limited thereto. In another embodiment, the light converting unit LU may not have the light blocking particles BP. In another embodiment, at least one of the light converting units LU may have at least one layer of the light converting film LCFb (or the light converting film LCFa) of the above variant embodiments.

Figure 7:
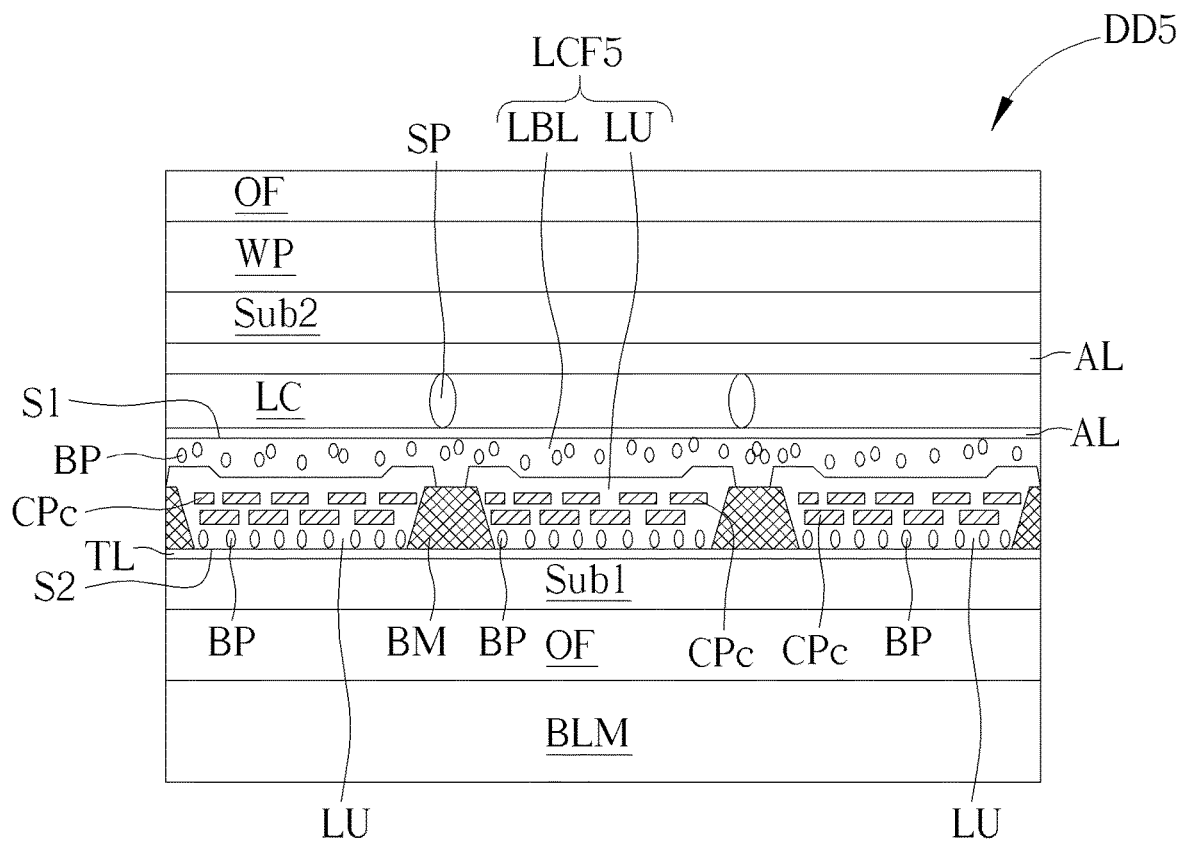
FIG. 7 is a schematic diagram illustrating a display device according to a fifth embodiment of the present disclosure.

Refer to FIG. 7, which is a schematic diagram illustrating a display device according to a fifth embodiment of the present disclosure. Compared with FIG. 6 of the third embodiment, the light converting particles CPc in the display device DD5 provided by this embodiment may include the quantum rods, the display device DD5 may further include a quarter wave plate WP, the quarter wave plate WP may be used as a circular polarizer, and the liquid crystal layer LC may be disposed between the light converting film LCF5 and the quarter wave plate WP. In some embodiments, the quarter wave plate WP is disposed on the second substrate Sub2, and the quarter wave plate WP is disposed between the second substrate Sub2 and one optical film OF (that may be the polarizer or retarder). In another embodiment, at least one of the light converting units LU may apply two layers of the light converting film LCFb or the quantum rods of the light converting film of the above variant embodiments.

Figure 8:
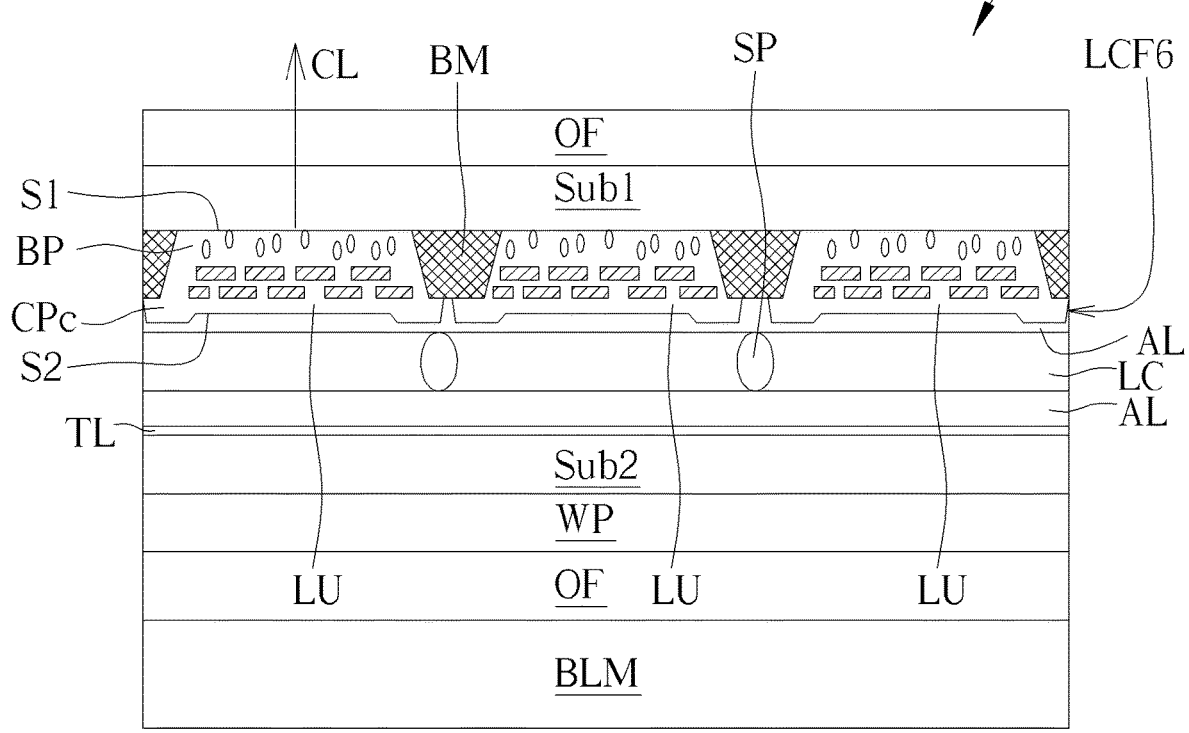
FIG. 8 is a schematic diagram illustrating a display device according to a sixth embodiment of the present disclosure.

Refer to FIG. 8, which is a schematic diagram illustrating a display device according to a sixth embodiment of the present disclosure. Compared with FIG. 3 of the first embodiment, the light converting particles CPc in the display device DD6 provided by this embodiment may include the quantum rods, the display device DD6 may further include a quarter wave plate WP, and the liquid crystal layer LC is disposed between the light converting film LCF6 and the quarter wave plate WP. In some embodiments, the second substrate Sub2 is disposed on the quarter wave plate WP, and the quarter wave plate WP is disposed between the second substrate Sub2 and one optical film OF (that may be the polarizer or retarder). In another embodiment, at least one of the light converting units LU may apply two layers of the light converting film LCFb of the above variant embodiment.

Figure 9:
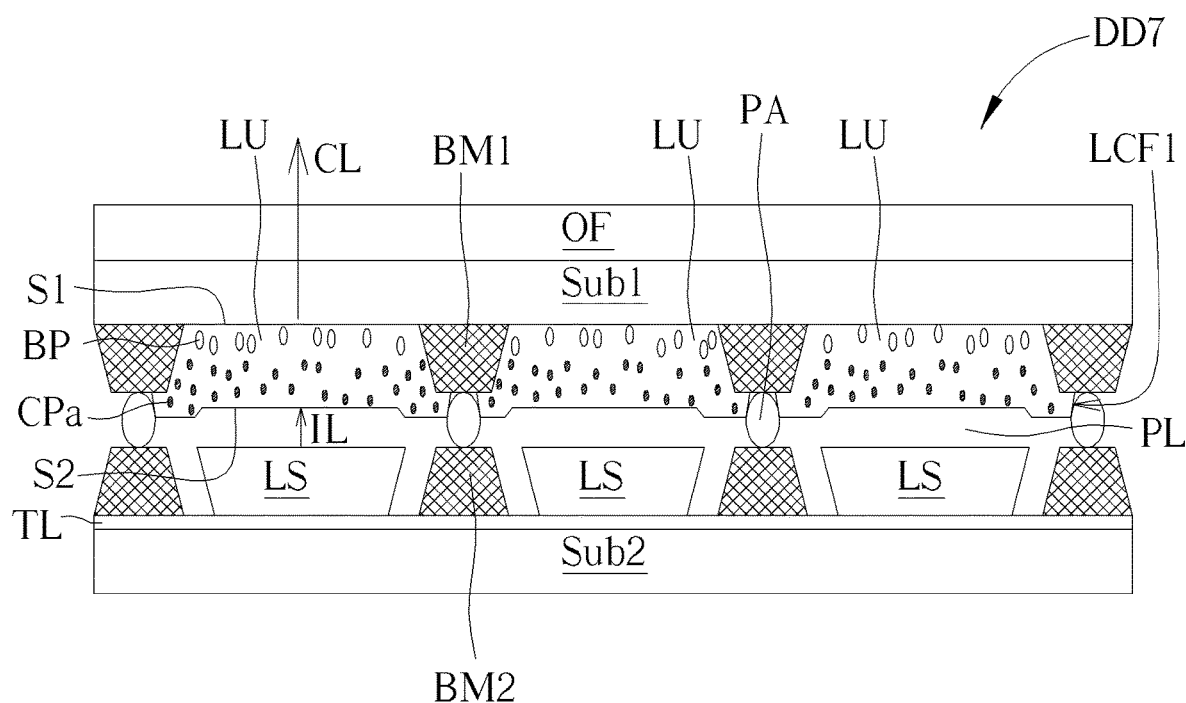
FIG. 9 is a schematic diagram illustrating a display device according to a seventh embodiment of the present disclosure.

Refer to FIG. 9, which is a schematic diagram illustrating a display device according to a seventh embodiment of the present disclosure. Compared with FIG. 3 of the first embodiment, the display device DD7 may be a self-emissive light emitting device. In this embodiment, the display device DD7 has a plurality of light sources LS for providing the input lights IL, and at least one light source LS may be disposed in a sub-pixel (or a pixel), and at least one light source may for example include an inorganic light emitting diode (LED) or an organic light emitting diode (OLED), mini LED, micro LED, or a quantum dot LED (QLED) or quantum dot, but not limited. Specifically, the display device DD7 may further have a first substrate Sub1, a black matrix BM1, a light converting film LCF1, a second substrate Sub2, black matrix BM2, a protection layer PL (or flat layer), a plurality of partitions PA, a TFT layer TL and an optical film OF. The first substrate Sub1, the black matrix BM1, the light converting film LCF1, the second substrate Sub2 may be the same as the first embodiment, and will not be detailed herein. The light sources LS may be disposed between the light converting film LCF1 and the second substrate Sub2, and the second surface S2 of the light converting film LCF1 faces or adjacent to the light source LS. In some embodiments, one light converting unit LU may correspond to one of light sources. For example, one light converting unit LU can convert the input light IL provided from the corresponding light source LS into the converted light CL. The TFT layer TL is disposed between the light sources LS and the second substrate Sub2, and the TFT layer TL may be disposed for driving the light sources LS. In some embodiments, the black matrix BM2 is disposed on the TFT layer TL. In some embodiments, the black matrix BM2 has a plurality of openings to define one sub-pixel (or one pixel), and at least one light sources LS may be disposed in (or adjacent to) one opening, but not limited. The black matrix BM2 may be disposed for separating the light source LS from each other. The protection layer PL is disposed on (or covers) the light sources LS for reducing the light sources LS from moisture. The partitions PA are disposed between the black matrixes BM1, BM2. The partitions PA may connect the black matrixes BM1, BM2 for separating the input lights IL from each other and include reflective material for effectively using the input lights IL. In some embodiments, the optical film OF may include a quarter wave plate playing as a circular polarizer, but not limited thereto. In another embodiment, at least one of the light converting units LU may apply two layers of the light converting film LCFb or the quantum rods of the light converting film of the above variant embodiments.

Figure 10:
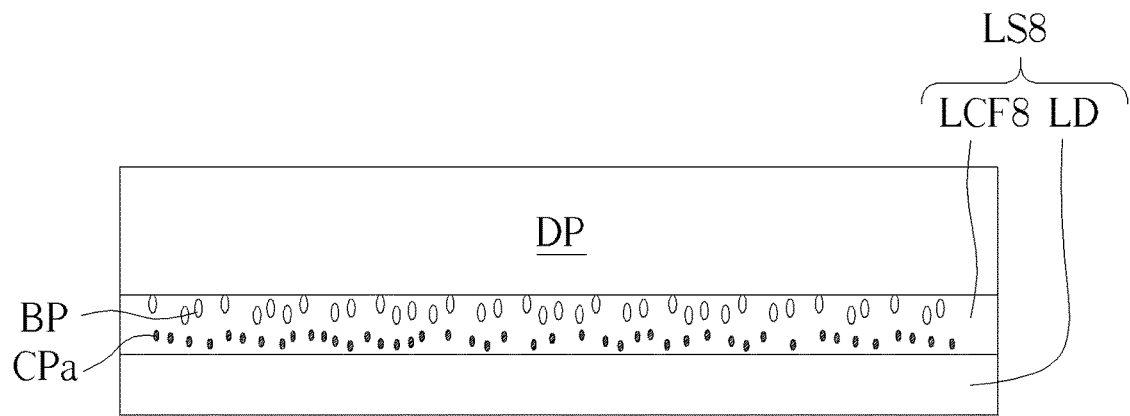
FIG. 10 is a schematic diagram illustrating a display device according to an eighth embodiment of the present disclosure.

Refer to FIG. 10, which is a schematic diagram illustrating a display device according to an eighth embodiment of the present disclosure. Compared with FIG. 3 of the first embodiment, the light converting film LCF8 may apply to a light source LS8. Specifically, the light source LS8 may further have a light emitting device LD under the light converting film LCF8, and the light converting film LCF8 may be disposed on (or cover) an emitting surface of the light emitting device LD. For example, the light source LS8 may be used as a backlight module, the light converting film LCF8 could be a quantum dot enhancement film (QDEF) or a light guide, and a display panel DP (not shown) is disposed on the light source LS8. The light converting film LCF may apply any one of the converting films of the above embodiments and variant embodiments.

In summary, through the ratio of the second content to the first content of the light converting film being designed to be ranged from 0.1 to 0.9, the light blocking particles of the light converting film can provide better scattering for the input light in the light converting film or provide absorption of the input light near the first surface, so as to reduce the input light from penetrating through the light converting film and convert the input light as much as possible into the converted light. Accordingly, the color of the output light emitted from the first surface can be close to or the same as the color of the converted light, thereby increasing the purity of the color of the output light. Therefore, the range of the color gamut of the display device can be raised.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A display device, comprising:
 a substrate; and
 a light converting film disposed on the substrate, the light converting film has a first surface and a second surface opposite to the first surface, and the light converting film has a thickness H in a normal direction;
 wherein the light converting film has at least one first element selected from the group consisting of Ti, Zr, Al, In, Zn, Sn, Sb, Si, Au, Ag, Cu, Pt, Fe, Co, Ni, and Mn,
 wherein the at least one first element conforms to the following condition: a content of the first element in a first region between the first surface of the light converting film and 0.1H of the light converting film is defined as a first content, a content of the first element in a second region between 0.1H of the light converting film and the second surface of the light converting film is defined as a second content, and a ratio of the second content to the first content is ranged from 0.1 to 0.9.

2. The display device of claim 1, wherein the at least one first element is selected from the group consisting of Ti, Zr, Al, In, Zn, Sn, Sb, and Si, and the ratio of the second content to the first content is ranged from 0.1 to 0.5.

3. The display device of claim 2, wherein the light converting film has at least one metal oxide comprising the at least one first element.

4. The display device of claim 1, wherein the at least one first element is selected from the group consisting of Au, Ag, Cu, Pt, Fe, Co, Ni, and Mn, and the ratio of the second content to the first content is ranged from 0.5 to 0.9.

5. The display device of claim 4, wherein the light converting film has at least one metal comprising the at least one first element.

6. The display device of claim 4, wherein a part in the second region closer to the first surface is defined as a first part, a part in the second region closer to the second surface is defined as a second part, and a content of the at least one first element in the first part is greater than a content of the at least one first element in the second part.

7. The display device of claim 1, wherein the light converting film has a plurality of first light blocking particles comprising at least one metal oxide, and the light converting film has a plurality of second light blocking particles comprising at least one metal.

8. The display device of claim 7, wherein the at least one metal oxide has at least one of the first elements selected from the group consisting of Ti, Zr, Al, In, Zn, Sn, Sb, and Si, and the at least one metal has at least another one of the first elements selected from the group consisting of Au, Ag, Cu, Pt, Fe, Co, Ni, and Mn.

9. The display device of claim 7, wherein the first light blocking particles are disposed in the first region, and the second light blocking particles are dispersed throughout the light converting film.

10. The display device of claim 7, wherein a size of at least one of the first light blocking particles is ranged from 50 nm to 600 nm, and a particle size of at least one of the second light blocking particles is ranged from 50 nm to 600 nm.

11. The display device of claim 1, wherein the light converting film further has at least one second element selected from the group consisting of Cd, Te, Pb, Cs, Rb, Mg, Se, and Ga, the at least one second element conforms to the following condition: a content of the second element in the first region of the light converting film is defined as a third content, a content of the second element in the second region of the light converting film is defined as a fourth content, a ratio of the third content to the fourth content is ranged from 0.1 to 0.9.

12. The display device of claim 11, wherein the light converting film has a plurality of light converting particles, and the light converting particles have the at least one second element.

13. The display device of claim 12, wherein the light converting particles have a plurality of quantum dots or a plurality of quantum rods.

14. The display device of claim 11, wherein the light converting film has a first layer and a second layer, the first layer is disposed between the second layer and the substrate, the at least one first element is disposed in the first layer, and the at least one second element is disposed in the second layer.

15. The display device of claim 1, further comprising a liquid crystal layer and an optical film, wherein the liquid crystal layer is disposed between the light converting film and the optical film.

16. The display device of claim 15, further comprising a backlight module, wherein the light converting film is disposed between the backlight module and the liquid crystal layer.

17. The display device of claim 15, further comprising a backlight module, wherein the optical film is disposed between the backlight module and the liquid crystal layer.

18. The display device of claim 1, further comprising a light scattering layer disposed on the second surface of the light converting film, and the scattering layer having at least one third element selected from the group consisting of Au, Ag, Cu, Pt, Fe, Co, Ni, and Mn.

19. The display device of claim 1, further comprising a light source providing an input light, and the input light entering the light converting film from the second surface.

20. The display device of claim 19, wherein the light source comprises an inorganic light emitting diode (LED), an organic light emitting diode (OLED), a mini LED, a micro LED or quantum dot LED (QLED).

* * * * *